United States Patent [19]
Caron et al.

[11] Patent Number: 5,591,519
[45] Date of Patent: Jan. 7, 1997

[54] FABRICATION MULTILAYER COMBINED RIGID/FLEX PRINTED CIRCUIT BOARD

[75] Inventors: A. Roland Caron, Hudson; Lee J. Millette, Litchfield, both of N.H.; John G. King, N. Andover, Mass.

[73] Assignee: Teledyne Industries, Inc., Los Angeles, Calif.

[21] Appl. No.: 451,017

[22] Filed: May 25, 1995

Related U.S. Application Data

[62] Division of Ser. No. 349,254, Dec. 5, 1994, Pat. No. 5,505,321.

[63] Continuation-in-part of PCT/US93/11684 Dec. 2, 1993.

[51] Int. Cl.⁶ ........................................................ B32B 9/00
[52] U.S. Cl. ......................... 428/344; 428/209; 428/352; 428/458; 428/901; 174/259; 174/260
[58] Field of Search ............................... 428/209, 242, 428/355, 344, 352, 458, 901; 174/259, 260

[56] References Cited

U.S. PATENT DOCUMENTS

| | | | |
|---|---|---|---|
| 4,861,648 | 8/1989 | Kleinschmidt et al. | 428/209 |
| 5,162,140 | 11/1992 | Taniguchi | 428/209 |
| 5,374,469 | 12/1994 | Hino et al. | 428/209 |

*Primary Examiner*—Patrick Ryan
*Assistant Examiner*—Cathy K. Lam
*Attorney, Agent, or Firm*—Hayes, Soloway, Hennessey, Grossman & Hage, P.C.

[57] ABSTRACT

Multilayer rigid flex printed circuits are fabricated from a novel basestock composite comprising two copper conducting sheets, bonded to insulator layers comprised of fiberglass sheets impregnated with an adhesive such as epoxy, wherein the insulator layers are both affixed to Kapton layers wherein said Kapton layers are not coextensive with the borders of the insulator layers. The basestock composite can then be imaged and etched on the conductor layers to form conductor patterns, laminated or coated with a coverlay of dielectric material, and the basestock can be cut at a point internal to its borders and into the Kapton layers thereby separating two imaged and etched conductor layers.

7 Claims, 4 Drawing Sheets

FABRICATION MULTILAYER COMBINED RIGID/FLEX PRINTED CIRCUIT BOARD

This is a divisional of application Ser. No. 08/349,254 filed on Dec. 5, 1994, now U.S. Pat. No. 5,505,321.

This application is a continuation-in-part of copending international application Serial No. PCT/US93/11684, filed Dec. 2, 1993, which international application designates the United States.

BACKGROUND OF THE INVENTION

1. Field of the Invention

The present invention relates to the fabrication of multilayer combined rigid and flex printed circuits having flexible printed circuits extending from the rigid board. In particular, the present invention relates to an improved process for the fabrication of multilayer combined rigid and flex printed circuits, wherein two circuit boards having rigid and flexible sections can be prepared from a novel basestock composite.

BACKGROUND OF THE INVENTION

Techniques for making multilayer rigid flex printed circuit boards are well known in the art. One early example of the prior art is disclosed in U.S. Pat. No. 3,409,732, assigned to the Assignee of the present application and whose teachings are incorporated by reference. Another example is disclosed in the parent of instant application, Serial No. PCT/US9311684, which is also assigned to the assignee of this application and whose teachings are incorporated herein by reference. Typically a rigid flex stacked printed circuit board includes flexible printed circuit cables extending from the periphery of the rigid section or sections. The rigid portions of the flex cables are typically used as sites for electronic components or mechanical hardware. It is important to note that the copper conductor in each plane or layer is fabricated from one continuous sheet of copper foil.

With improvements in electronic technology, there has been a constant need for advances in electronic packaging. This need has led to more complex multilayer rigid flex printed circuit boards with many boards now using up to twenty-five, or even more, layers of circuitry. However, severe problems developed when the rigid circuit portions included many layers of conductors and holes plated through with copper to provide conductor barrels connecting the conductor layers.

One particular problem, reported on and discussed in U.S. Pat. No. 4,800,461, assigned to the assignee of the present application, and whose teachings are incorporated by reference, described the fact that in multilayer rigid flex boards which include insulator materials such as acrylic adhesive and Kapton (Kapton is a trademark of E. I. Dupont de Nemours and Company Inc. for polyimide film), the insulating materials placed a "Z-axis" stress on plated through holes. The coefficient of thermal expansion, it was reported, of the acrylic adhesive (Z-axis expansion) was the dominate influence. It was observed that because of the amount of acrylic required in many multilayer rigid flex applications, all plated through holes are stressed, with many cracking, making the boards unusable.

To overcome this problem, the '461 patent reported on a novel process to provide a rigid section incorporating insulator materials which, when subjected to elevated temperatures, did not expand in the Z direction to cause difficulties, including delamination and cracking of plated copper barrels. Stated another way, in the '461 patent, the materials causing undesirable expansion in the Z direction in the multilayer rigid section of the board, and the materials absorbing excessive amounts of moisture, such as acrylic adhesives and Kapton, were eliminated from the boards rigid section.

However, although the '461 patent was extremely successful in addressing the various problems recited therein, and in particular, the problem of thermal stresses described above, the process for fabrication of the rigid flex printed circuits has remained limited to the fabrication of a multilayer combined rigid and flex printed circuit board wherein two circuit boards are always prepared from a basestock composition, and remain attached to one another via the prepreg. In other words, the process of fabrication according to the teachings of the prior art begin with the step of laminating two conductor layers (i.e. copper layers) to a single insulator layer (prepreg) followed by imaging and etching. Accordingly if one of the two bonded conductor layers was somehow improperly imaged, it was necessary to discard the entire lamination.

Other problems also persist. One problem concerns the inability to satisfactorily mount die and interconnection lines to flexible substrate sections. Substrates currently in use distort and/or frequently delaminate when subjected to thermosonic bond techniques used to bond die, and during formation of fine line interconnection lines in the substrate. These conditions can yield unsatisfactory results in applications where high levels of design integration and uniformity among similar features on the substrate are required.

It is therefore an object of this invention to provide a novel basestock composition of sufficient planarity and rigidity to permit adequate handling and further processing thereof, and which can be separated into two individual layers each comprising an imaged copper layer laminated to a fiberglass sheet which is impregnated with adhesives such as an epoxy, which has been laminated and bonded to acrylic coated polyimide film.

It is yet another object of this invention to provide a multilayer combined rigid and flex printed circuit substrate that provides sufficient rigidity to permit satisfactory mounting of die using thermosonic bonding techniques and formation of fine line interconnections.

SUMMARY OF THE INVENTION

The present invention provides a multilayer rigid flex printed circuit board fabricated by a novel process and from a novel basestock composite wherein two copper sheets are laminated to a prepreg and in-between said laminated copper sheets is placed at least two layers of polyimide material carrying an acrylic adhesive that is not coextensive with the borders of the prepreg, such that the basestock can be imaged and processed in the usual manner, and laminated or coated with a coverlay of dielectric material, and such that cutting the edges of the basestock material, after imaging, at a location internal to the basestock border provides a cut into the polyimide layer, thereby allowing for separation of the two individual imaged copper layers and their supporting prepreg.

In a further embodiment, the present invention provides a printed circuit basestock composite wherein two conductor sheets are laminated to a polyimide insulating layer carrying an acrylic adhesive, and in between said laminated conducting sheets is placed a release layer that is not coextensive with the borders of the polyimide insulating layer, and wherein the release layer is further separated by a carrier layer which is coextensive with laminate borders, characterized in that the carrier layer provides rigidity to the laminate. This laminate can therefore be imaged and processing in the usual manner, and cutting the edges of this basestock material, after imaging, at a location internal to the basestock border provides a cut into the release layer, allowing for separation of the two individual imaged copper layers, with removal of the carrier layer.

BRIEF DESCRIPTION OF THE DRAWINGS

The foregoing and other features and advantages of the present invention will be more readily understood and will become apparent from the following detailed description taken in conjunction with the drawings, in which.

DETAILED DESCRIPTION OF THE INVENTION

Figure 1:
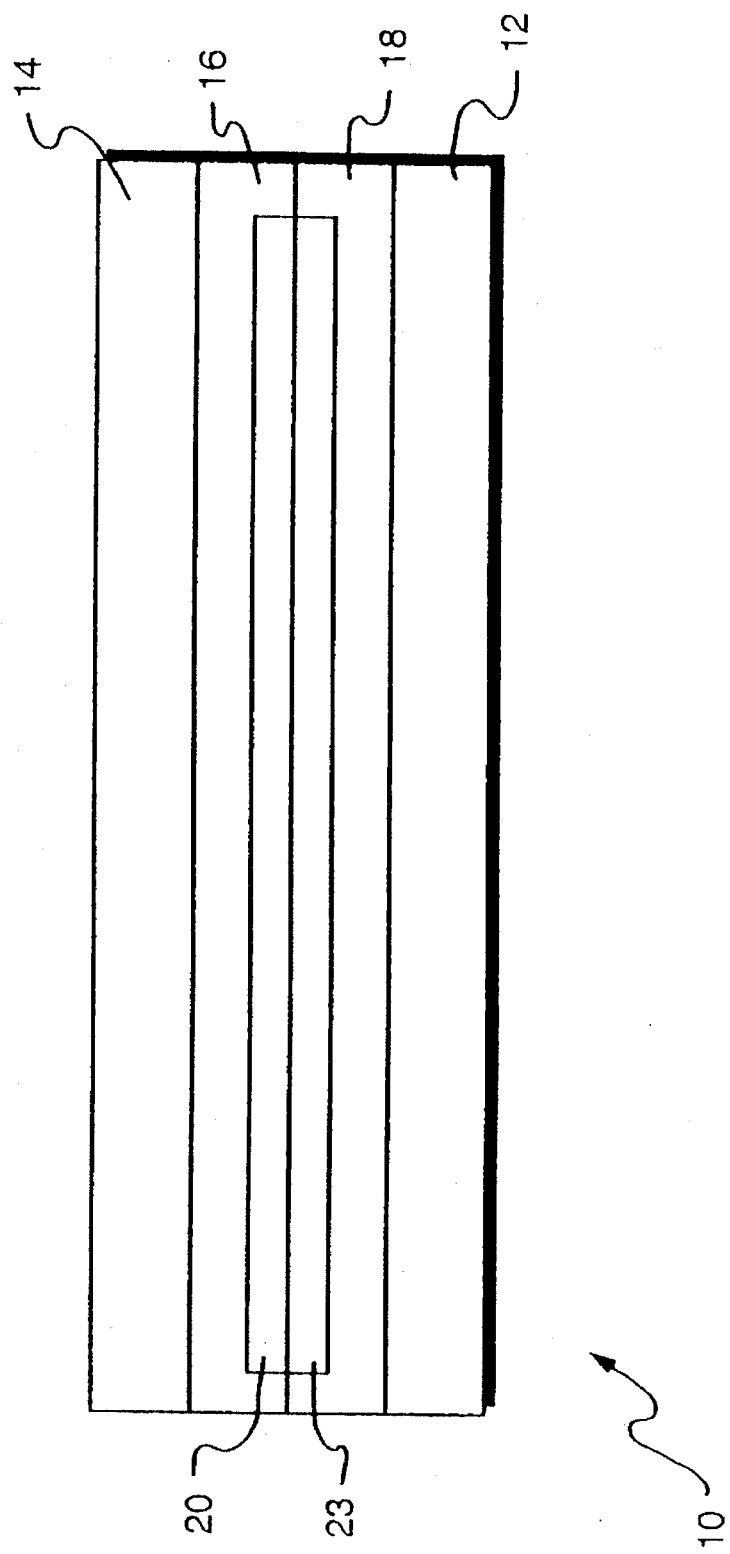
FIG. 1 is an exploded view of the novel basestock composite.

In the first exemplary embodiment of the invention shown in FIG. 1, the novel basestock composite 10 is shown to comprise two copper conducting sheets 12 and 14, for example, one or two ounce copper, bonded to insulator layers 16 and 18 comprised of fiberglass sheets impregnated with an adhesive such as epoxy, and commonly referred to as a prepreg. Also shown in FIG. 1 are the two layers of Kapton material 20,23 which are shown as not being coextensive with the borders of the insulating layers 16 and 18.

Accordingly, it can be appreciated that in the method of preparation of the novel basestock composite 10, a pair of conducting sheets or layers, 12 and 14, are laminated to the opposite surfaces of insulating layers 16 and 18, wherein the insulating layers are both affixed to Kapton layers 20,23 and wherein said Kapton layers are not coextensive with the borders of the insulating layers. It can be appreciated that the basestock composite comprising the pair of conducting sheets has sufficient planarity and rigidity to permit handling and further processing thereof, and in particular, imaging to form conductor patterns.

Figure 2:
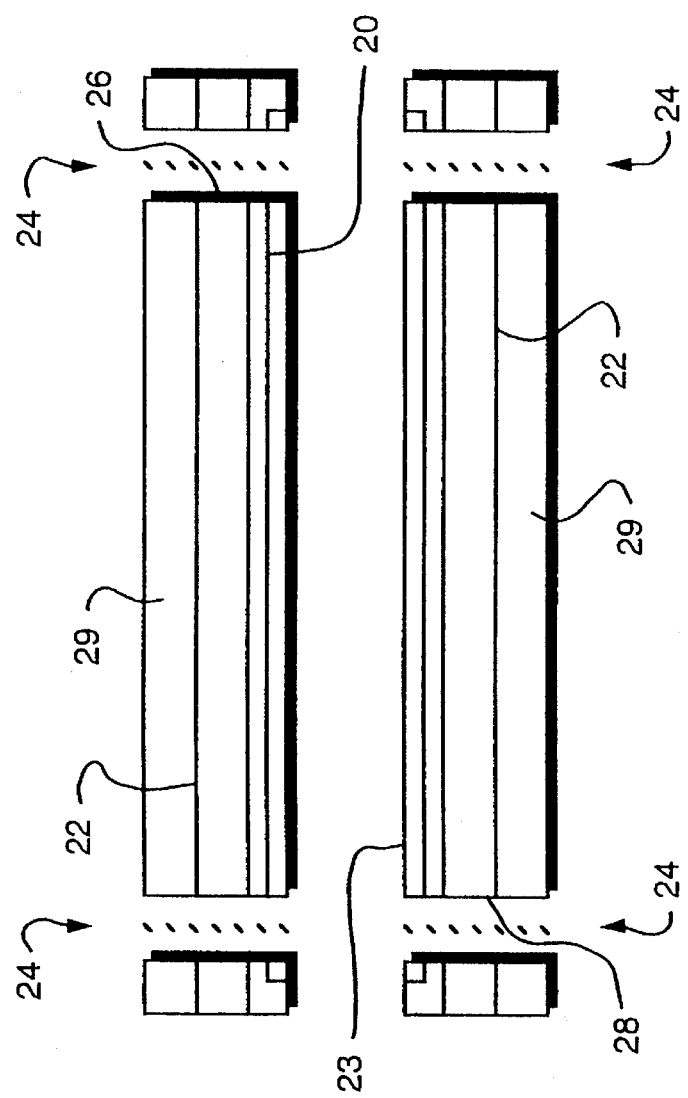
FIG. 2 is an exploded view of the novel basestock composite showing it cut at a point internal to its borders and into the Kapton layers.

Turning then to FIG. 2(not drawn to scale with regards to the thickness of the individual layers), the basestock composite which has been imaged and etched to form conductor patterns 22, is cut at a point internal to its borders 24 and into and through the Kapton layers 20,23 and the two conductor layer patterns 26 and 28 are separated. Each conductor layer can then be further processed, as described below. (It is to be noted however, and as specifically shown in FIG. 2, this particular configuration lends itself to cover-coating 29 prior to separation.)

Figure 3:
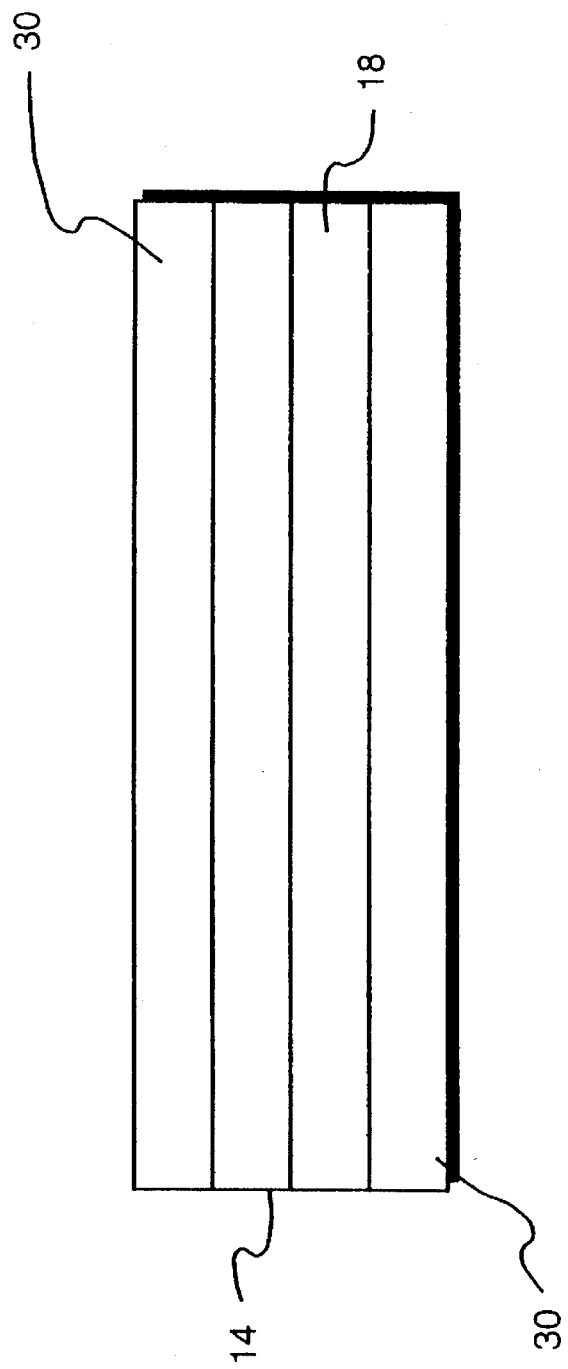
FIG. 3 is an exploded view of the novel basestock composite with a prepreg and Kapton/acrylic covercoat.

FIG. 3 shows one of the separated conductive layers 14 and its adjacent prepreg 18 further covered with another flexible insulating layer of a Kapton/acrylic covercoat 30. Alternatively, the Kapton/acrylic covercoat 30 can be replaced with a less expensive photoimagable solder mask.

Figure 4:
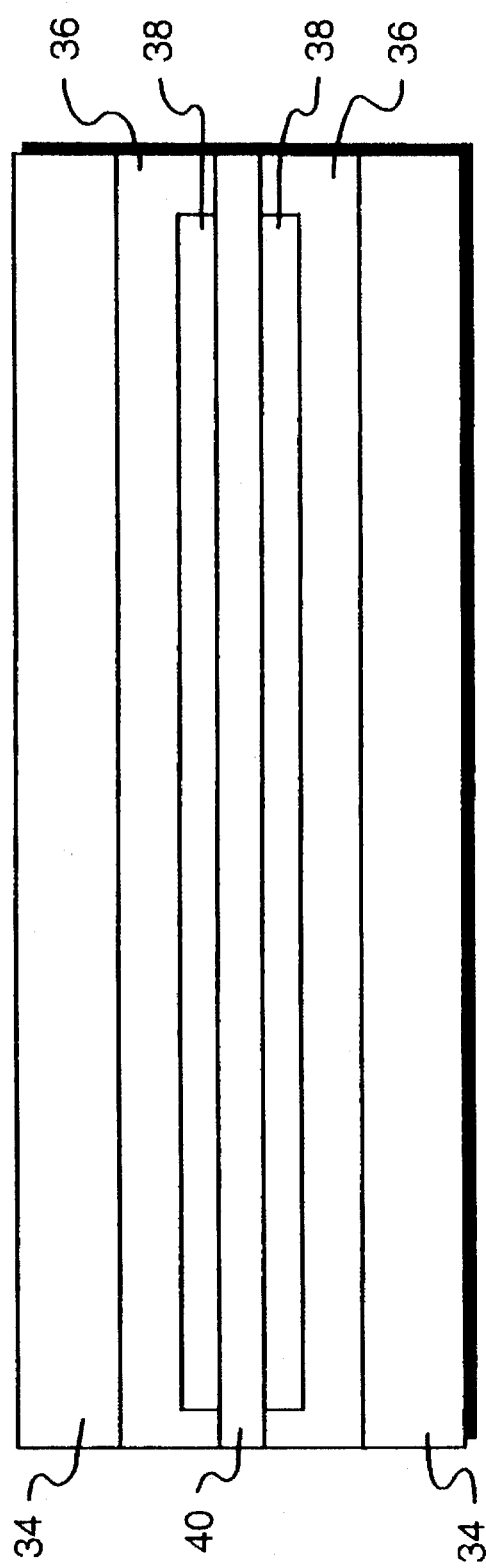
FIG. 4 is an exploded view of the novel basestock composite, wherein a carrier layer is placed within the release layer of the laminate.

FIG. 4 shows an exploded view of the novel basestock composite wherein a carrier layer is placed within the release layer of the laminate. That is, with reference to FIG. 4, conducting layers 34 are affixed to Kapton layers 36 carrying an acrylic adhesive. At 38 there is placed a release layer that is not coextensive with the borders of the polyimide insulating layer, and wherein the release layer is further separated by a carrier layer 40 which is coextensive with the laminate borders, characterized in that the carrier layer provides rigidity to the laminate. Preferably, the polyimide layers comprise Kapton, and the carrier layer is fiberglass, and the release layer is poly(vinyl fluoride) film, or Tedlar.

It can be appreciated that the basestock composite shown in FIG. 4, can be imaged and etched to form conductor patterns, followed by cutting the basestock composite at a point internal to the borders of the composites and into the release layer. At this point the two imaged and etched conductor layers can be separated and the carrier layer can be removed. Accordingly, by incorporating the carrier layer in such a fashion, the two conductor sheets can be imaged and etched, and the carrier layer provides sufficient flexural strength to the composite for the required imaging and etching operation. Furthermore, it will be appreciated that the construction shown in FIG. 4 can also be cover-coated prior to separation.

While the invention has been shown and described with reference to the above described embodiments, which provide rigid flex circuits affording advantages not found in prior art printed circuits, it will be understood that various changes may be made without departing from the spirit and scope of the invention as defined in the appended claims.

What is claimed is:

1. A printed circuit basestock composite which allows for the preparation of two flexible circuit boards that can be separated, after imaging, comprising a pair of conductor layers, a pair of insulating layers, and a pair of polyimide layers, wherein said conductor layers are laminated to said insulating layers wherein the insulating layers are both affixed to said polyimide layers and wherein said polyimide layers are not coextensive with the borders of the insulating layers, thereby forming a basestock composite which can be separated as between said polyimide layers after imaging.

2. The rigid flex basestock composite of claim 1 wherein the polyimide layers are Kapton.

3. The rigid flex basestock composite of claim 1 wherein the insulating layers are fiberglass layers impregnated with an epoxy adhesive.

4. A printed circuit basestock composite which allows for the preparation of two flexible circuit boards, that can be separated, after imaging and etching, comprising two conductor sheets each laminated to one side of a polyimide layer the other side of said polyimide layer coated with an acrylic adhesive, said coated polyimide layer of said conductor sheets being affixed to a release layer that is not coextensive with the borders of the polyimide layer, and wherein the release layer is separated by a carrier layer which is coextensive with the borders of said polyimide layers such that the acrylic adhesive of said polyimide layers bonds to said carrier layer, and wherein the carrier layer provides rigidity to the basestock.

5. The basestock composite of claim 4 wherein the polyimide layer is Kapton.

6. The basestock composite of claim 4 wherein the release layer is poly(vinyl fluoride).

7. The basestock composite of claim 4 wherein the carrier layer is fiberglass.

* * * * *